United States Patent [19]
Wendell

[11] Patent Number: 5,958,075
[45] Date of Patent: Sep. 28, 1999

[54] EFFICIENT ON-PITCH SCANNABLE SENSE AMPLIFIER

[75] Inventor: Dennis L. Wendell, Pleasanton, Calif.

[73] Assignee: Advanced Micro Devices, Inc., Sunnyvale, Calif.

[21] Appl. No.: 08/938,393

[22] Filed: Sep. 26, 1997

[51] Int. Cl.⁶ .............................. G06F 17/00; G06F 11/00
[52] U.S. Cl. ......................... 714/726; 714/727; 714/729
[58] Field of Search ..................... 714/726, 727, 714/729, 30

[56] References Cited

U.S. PATENT DOCUMENTS

| | | | |
|---|---|---|---|
| 4,314,353 | 2/1982 | Gunter et al. | 710/126 |
| 4,679,170 | 7/1987 | Bourassa et al. | 365/154 |
| 4,872,142 | 10/1989 | Hannai | 365/189.07 |
| 5,244,820 | 9/1993 | Kamata et al. | 438/514 |
| 5,414,714 | 5/1995 | Gladden et al. | 714/724 |
| 5,461,000 | 10/1995 | Liang | 438/384 |
| 5,485,466 | 1/1996 | Lyon et al. | 371/22.3 |
| 5,494,842 | 2/1996 | Azmanov | 438/599 |
| 5,517,061 | 5/1996 | Azmanov | 257/758 |
| 5,608,681 | 3/1997 | Priebe et al. | 369/77.2 |

OTHER PUBLICATIONS

Hodges et al., "Analysis and Design of Digital Integrated Circuits"; McGraw–Hill Publishing Co., 1988, pp. 24–25, 311.

*Primary Examiner*—Ly V. Hua
*Attorney, Agent, or Firm*—Skjerven, Morrill, MacPherson, Franklin & Friel, LLP

[57] ABSTRACT

A scannable sense amplifier is provided in which the transfer circuits are implemented using only a pair of NMOS transistors added to column pitched circuits between adjacent sense amplifiers.

15 Claims, 10 Drawing Sheets

EFFICIENT ON-PITCH SCANNABLE SENSE AMPLIFIER

CROSS-REFERENCE TO RELATED APPLICATIONS

This application relates to application Ser. No. 08/938,734 (attorney docket number M-5153 US), by Dennis L. Wendell, filed the same day as the present application and entitled "Scannable Sense Amplifier Circuit" which application is incorporated herein by reference in its entirety.

BACKGROUND OF THE INVENTION

1. Field of the Invention

This invention relates to semiconductor products and more particularly to memory arrays utilizing sense amplifier circuits.

2. Description of the Related Art

Large memory arrays are used for storage of data and program values in conventional computer systems. In order to increase the amount of data that can be stored in memories, the memory cell which stores the digital value is typically made as small as practical. Bit lines are used to convey the information stored in the storage cells when the memory array is read. However, the voltage differences between a one and a zero, typically represented as a differential voltage on the bit lines is relatively small due to the desire to keep the size of the memory cell small. Therefore, sense amplifier circuits are used to sense whether the stored value represents a digital zero or a one and to amplify the signal to a voltage value which can be used by other circuitry utilizing the stored data and program values.

In addition to functioning as a sense amplifier, some designs have exploited the sense amplifiers for testing purposes to provide greater test visibility into the memory array than available with other test techniques. Particularly, one test approach provides for scan access to the sense amplifiers used in the memory array. Such an approach arranges the sense amplifiers into a scan chain so that the values in the sense amplifiers can be serially shifted (or scanned) through the scan chain until the shifted values are made available to an external observer. However, scanning typically requires a two flip-flop or latch configuration for each data bit desired to be shifted out.

Figure 1:
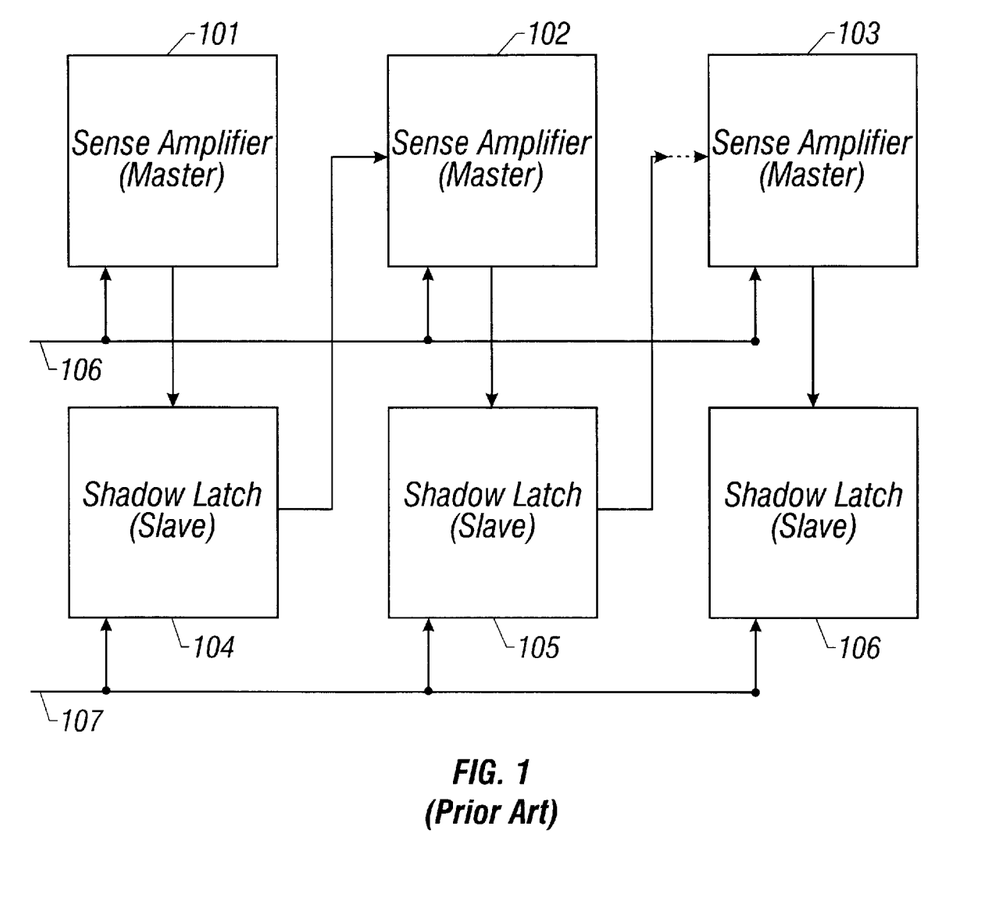
FIG. 1 shows a prior art sense amplifier scan technique employing shadow slave flip-flops.

Thus, designs such as the one shown in FIG. 1, showing several sense amplifiers configured in a scan chain, have been utilized for scanning sense amplifiers. Once data has been read from the storage array into sense amplifiers 101, 102 and 103, the data may be shifted into slave flip-flops 104, 105 and 106 on assertion of clock 107. The data may then be shifted through the scan chain by alternately applying clock 106 to shift data into the master flip-flops from the slave flip-flops and clock 107 to shift data into the slave flip-flops. The sequence of alternate clocks is applied until data has been shifted completely through the scan chain.

The approach shown in FIG. 1 requires an extra (or shadow) flip-flop for each sense amplifier. That approach is costly because the extra flip-flop occupies an area in each column of the array which can be comparable to the size of the sense amplifier itself. Further, the inclusion of the slave flip-flop can slow down the normal operation of the sense amplifier because of the increased wiring required to connect to the slave flip-flop to the sense amplifiers.

In order to eliminate the need for the slave sense amplifiers, another prior art sense amplifier scan approach configures alternate sense amplifier latches as master and slave latches such that alternate sense amplifier latches are allowed to overwrite data stored in a next adjacent latch. However, such prior art techniques have not considered efficient design of such master/slave latches. Thus, there is a need to provide a scan approach for sense amplifiers that addresses the issue of circuit minimization and efficiency in addition to the desire to avoid costly extra logic.

SUMMARY OF THE INVENTION

Accordingly, one embodiment of the invention provides an efficient scannable sense amplifier in which the transfer circuits are implemented using only a pair of NMOS transistors added to column pitched circuits between adjacent sense amplifiers. Each of the sense amplifiers includes a pair of cross coupled transistors. The sense amplifiers include a plurality of first polysilicon structures extending in a horizontal direction along a first row in a reference plane generally parallel to a surface of a semiconductor substrate, each of the first polysilicon structures extend generally in a vertical direction parallel to the surface. A first active region extends in a horizontal direction parallel to the surface and intersects the first polysilicon structures, thereby forming first transistors having a channel of a first conductivity type. Each of the first transistors are a first transistor of the pair of cross coupled transistors. A plurality of second polysilicon structures extends in the horizontal direction along a second row parallel to the surface. Each of the second polysilicon structures extend generally in the vertical direction and parallel to the surface. The second row is disposed vertically below the first row in the plane. A second active region extends horizontally in a direction parallel to the surface and intersects the second polysilicon structures, thereby forming second transistors having a channel of the first conductivity type. Each of the second transistors is a second transistor of the pair of cross coupled transistors. A plurality of third polysilicon structures extend in a horizontal direction parallel to the surface. Each of the third polysilicon structures extend parallel to the surface in a vertical direction and each of the third polysilicon structures are disposed between two of the first polysilicon structures and two of the second polysilicon structures. The third polysilicon structures extend sufficiently in a vertical direction to intersect the first and second active regions, thereby forming respectively a third and fourth group of transistors having a channel region of the first conductivity type. The third and fourth group of transistors, which form the transfer circuits, respectively couple adjacent ones of the first and second groups of transistors.

BRIEF DESCRIPTION OF THE DRAWINGS

The present invention may be better understood, and its numerous objects, features, and advantages made apparent to those skilled in the art by referencing the accompanying drawings wherein the use of the same reference symbols in different drawings indicates similar or identical items.

DESCRIPTION OF THE PREFERRED EMBODIMENT(S)

Figure 2:
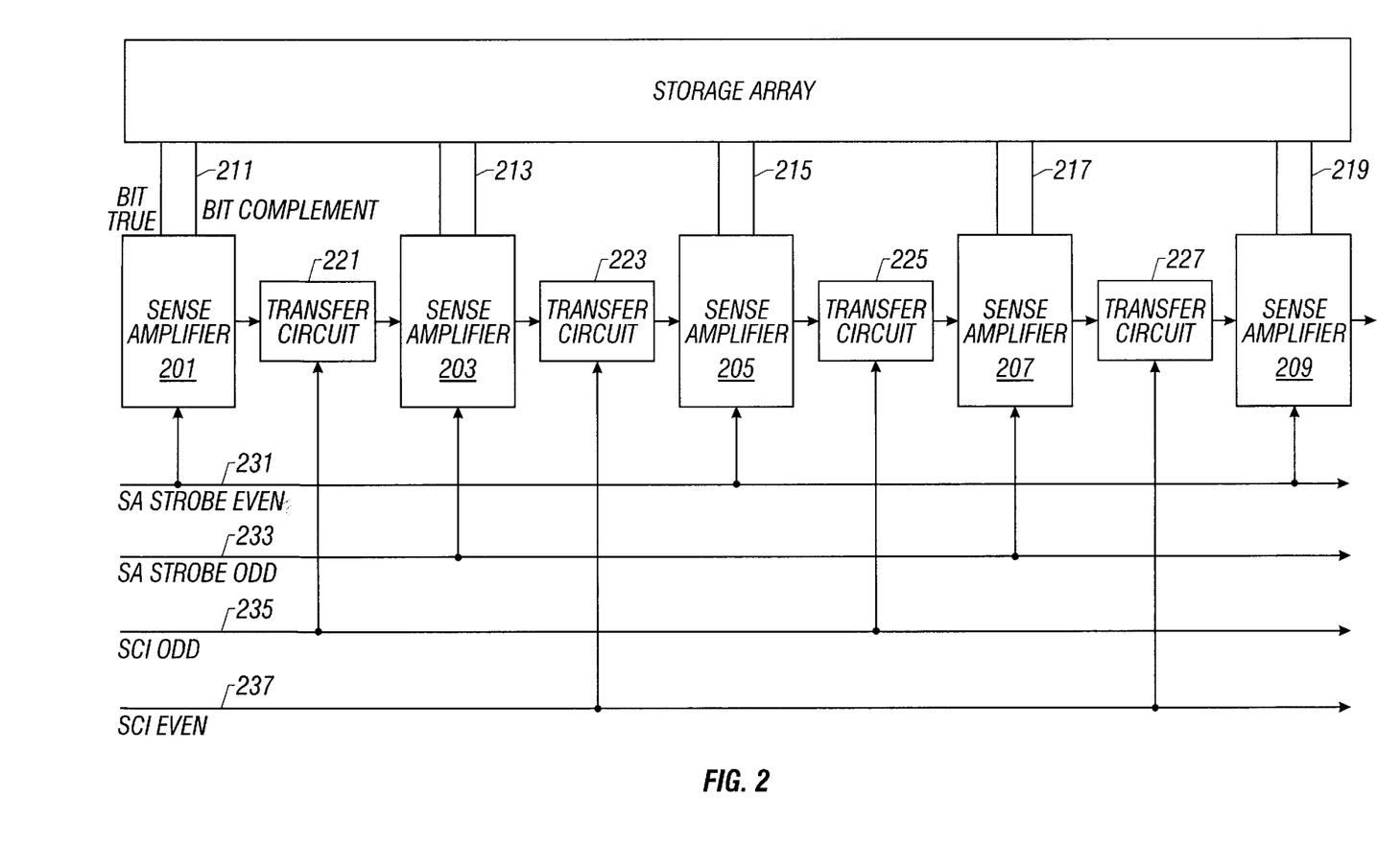
FIG. 2 shows a block diagram of sense amplifiers and transfer circuits and associated clocks according to the present invention.

Referring to FIG. 2, a block diagram of sense amplifiers configured in a scan chain according to the present invention is shown. A plurality of sense amplifiers 201 through 209 are coupled to storage array 210 through respective bit line pairs 211 through 219. In the illustrated embodiment, the bit lines pairs represent the bit true and bit complement value of the value stored in the storage array. The number of sense amplifiers shown is intended to represent a subset of the sense amplifiers found in a typical memory array which typically can be of the order of 128 or 256 or greater. Transfer circuits 221 through 227 are disposed between adjacent sense amplifiers to couple one sense amplifier to another sense amplifier for scan purposes. In addition, clock signals 231 and 233 are provided to the sense amplifiers. Clock signal 231, sense amp (sa) strobe even is coupled to the even numbered sense amplifiers which in the illustrated embodiment are sense amplifiers 201, 205 and 209. The designation of odd and even sense amplifiers may vary. Clock signal 233, sense amp (sa) strobe odd, is coupled to the odd sense amplifiers. The sense amplifier strobe signals 231 and 233 are used both functionally, to latch in values represented by the bit lines during a read of storage array 210 and are also utilized in scan operation of the sense amplifiers. The transfer circuits are also separated into alternate odd and even groups with each group coupled to different transfer signals to provide for scan capability. Thus, transfer circuits 221 and 225 are coupled to scan in odd (sci odd) signal 235 while transfer circuits 223 and 227 are coupled to scan in (sci) signal 237. The sci odd and even signals act as enables which should be setup before the appropriate clock—sense amp strobe odd or even.

Figure 3:
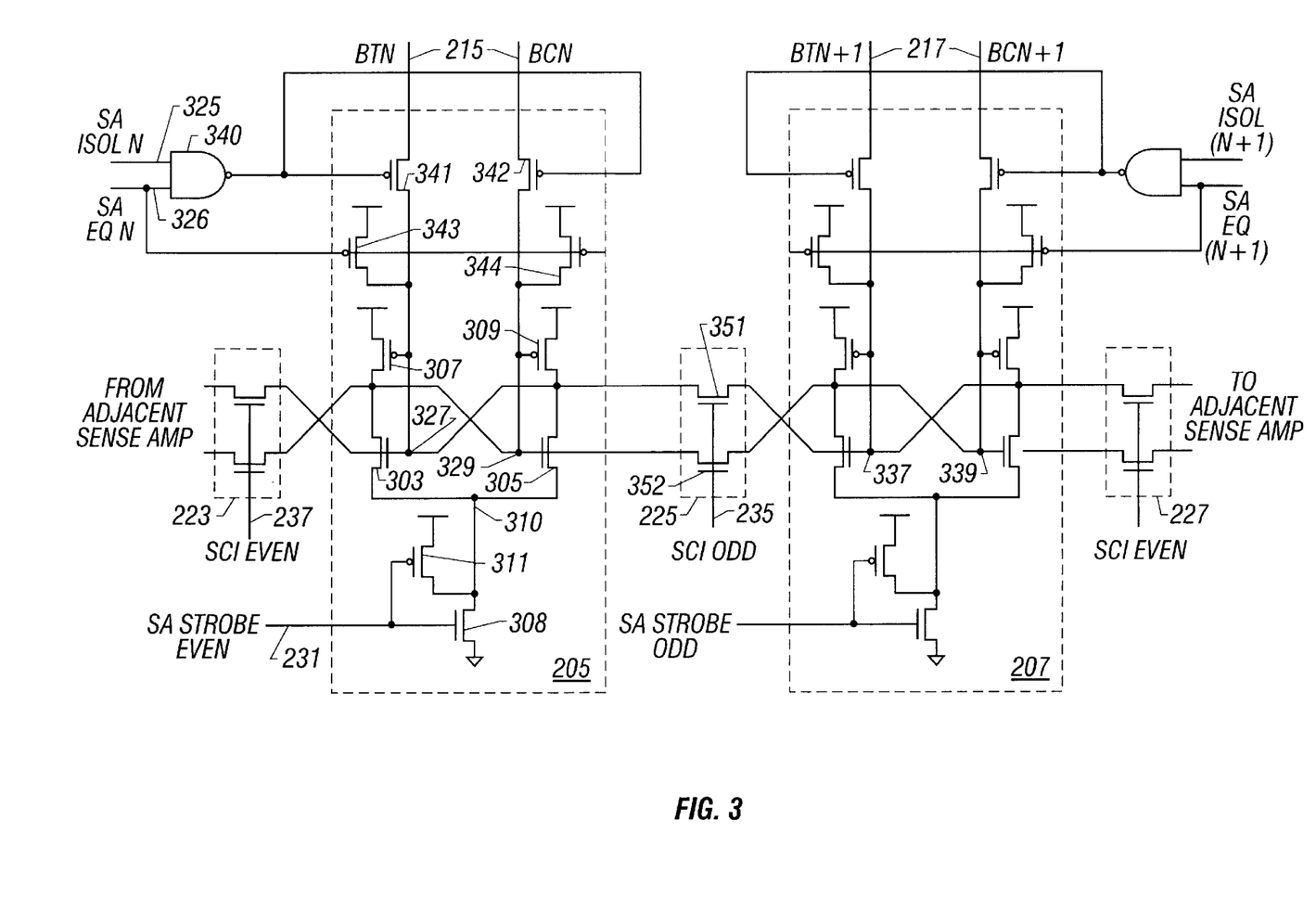
FIG. 3 shows a circuit diagram of the sense amplifiers and transfer circuits according to the invention.

FIG. 3 shows a detailed circuit diagram of two of the sense amplifiers and three of the transfer circuits of FIG. 2 according to one embodiment of the invention. Sense amplifier 205 is coupled to bit lines (bit true—btn) and (bit complement—bcn) 215. Isolation transistors 341 and 342 isolate the sense amplifier from the bit lines except when the sense amplifier is sensing the voltage contained on the bit lines. The isolation strobe 325 is logically combined in NAND gate 340 with an equilibrate signal 326. The equilibrate signal 326, when asserted, causes the internal sense amplifier nodes 327 and 329 to be pulled up to $V_{DD}$.

When the sense amplifier is sensing the voltage on the bit lines, the voltage differential will be sensed by use of the cross coupled NMOS transistors 303 and 305 and PMOS transistors 307 and 309 which are coupled to $V_{DD}$. The sensed value will be latched at a voltage with a significantly greater differential than present on the bit lines, e.g., at close to 0 or $V_{DD}$ according to the voltage on the bit lines. The sensed value is latched upon application of the sense amp strobe even signal 231 to latching transistor 308. In the illustrated embodiment, once sense amp strobe 231 is brought low, node 310 is pulled high through transistor 311. Sense amplifier 207 which is coupled to bit lines 217 (bit (n+1) and bit complement (n+1)), functions in a manner identical to sense amplifier 205.

In order to couple the sense amplifiers into a scan chain without incurring the overhead of shadow latches, transfer gates 223, 225 and 227 may be used. Because it is desirable to try and minimize the circuitry for the transfer gates, each transfer gate is implemented in the illustrated embodiment using only a pair of NMOS transistors. The transfer gates may be added to column pitched circuits between adjacent sense amplifiers as described further herein. Auxiliary control circuits (not shown) activate sense amplifier strobes in odd even combinations to serially shift data through the chain.

Figure 4:
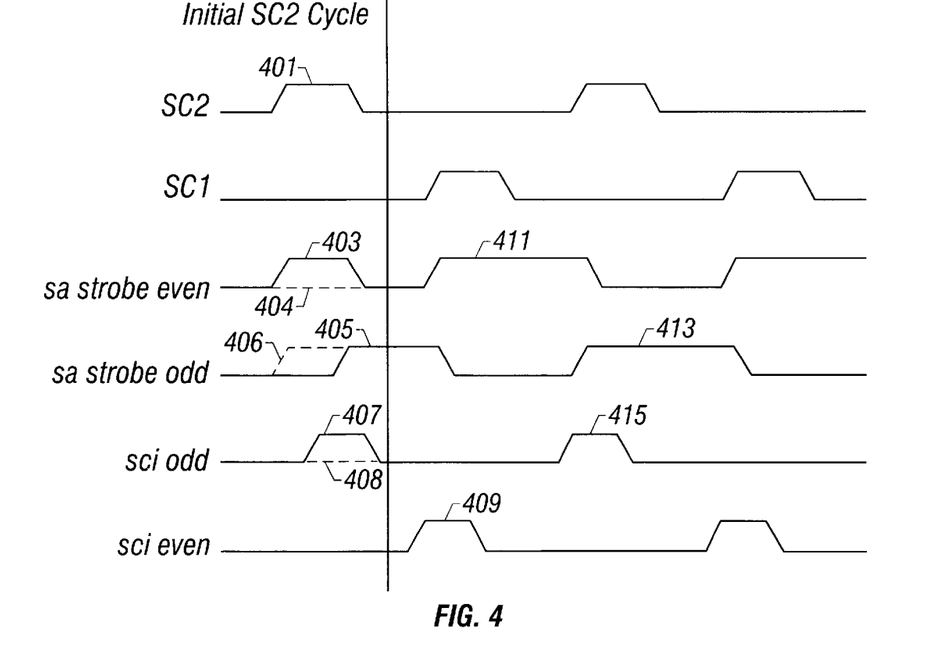
FIG. 4 shows a timing diagram of the clocks used in FIGS. 2 and 3.

A timing diagram of a scan operation according to one embodiment of the invention in shown in FIG. 4. SC2 and SC1 clocks, which refer to scan clocks, which are typically nonoverlapping, are used to serially shift data through scan chains contained on the integrated circuit as is known in the art. In the illustrated embodiment, at the beginning of a scan cycle, the initial SC2 clock will load the sense amplifiers by activating those sense amplifiers that were active on the preceding read cycle. That may be accomplished by recirculating the read address most recently used in a read operation. In one embodiment, that recirculation may be accomplished by using a multiplexer on the input to the address registers of the memory array such that an initial SC2 scan clock causes a recirculated address value to be loaded back into the memory latches.

In a test or debug environment, a typical scenario to analyze the memory is as follows. Address and appropriate memory control information is scanned into the integrated circuit to set up a memory read operation. A system clock may then be applied to clock the address and control information into the memory. A subsequent scan operation causes the address of the recent read to be reloaded on the first SC2 clock cycle of the subsequent scan operation to activate the same sense amplifiers that were previously activated on the prior read operation.

The sense amplifiers that receive the sense amp strobe signals will be either those designated as even or those designated as odd. A particular address should map to either even or odd columns and thus even or odd sense amplifiers. Thus, in one example, several bits of the address may be used to determine if an address maps to even or odd columns so it is known whether to assert even or odd sense amp strobes. Note that all even or all odd sense amplifiers may not be activated on a particular read operation since the read operation may involve, e.g., only one fourth of the columns in the storage array. However, for scanning purposes, either all the even or all the odd sense amplifiers receive a latch strobe on the first SC2 cycle if the previous read address corresponded to even or odd columns, respectively.

Referring to FIG. 4, a scan operation when the last read address was an address that used columns and associated sense amplifiers designated as even is considered. During the initial SC2 cycle 401 as shown in FIG. 4, if the last address read was an even address, the sa strobe even signal 403 is asserted causing the value represented by the voltages on respective true and complement bit lines supplied to even sense amplifiers to be latched in the even sense amplifiers. Referring to the circuit shown in FIG. 3, the sa strobe even signal causes the values on true and complement bit lines 215 to be latched into the flip flop formed by cross coupled NMOS transistors 303 and 305. Note that the isolation strobe 325 must be asserted to couple the bit lines into the sense amplifier. In the illustrated embodiment, the isolation strobe is asserted during the SC2 clock and is active during at least the initial portion of sa strobe even signal 403.

Towards the end of the initial SC2 cycle, the sa strobe odd signal is asserted along with the sci odd signal. The assertion of the sci odd signal at 407 causes the voltage levels present on two internal nodes, 327 and 329, in sense amplifier 205, to be provided to internal nodes 337 and 339 in sense amplifier 207. The assertion of the sa strobe odd signal 233 causes the voltage values provided by transfer circuit 225 to be latched into sense amplifier 207. Thus, the value latched in master latch 205 is transferred in the initial SC2 cycle to slave latch 207.

The scan operation continues as follows. The assertion of the sci even pulse at 409 along with the assertion of sa strobe even at 411 causes the values in the slave latches, including latch 207 to be transferred into the adjacent even master sense amplifiers, including master 209 (see FIG. 2). The assertion of the sa strobe odd signal and sci odd signal at 413 and 415 respectively, transfers the values in the master latches to adjacent slave latches. The sequence of shifting data from master to slave and slave to master continues until the values are shifted out of the sense amplifiers onto a pin of the chip or into another internal scan string which can be subsequently retrieved by an external test apparatus.

FIG. 4 also illustrates the clocking scheme of the illustrated embodiment when the read address is an address which is mapped into odd columns and associated odd sense amplifiers. In that case the initial SC2 cycle is modified. The dotted line 404 indicates that the initial sa strobe even signal is not asserted as in the previous case. Additionally, assertion of the sa strobe odd signal is shifted to earlier into the initial SC2 cycle as shown by dotted line 406 so as to coincide with the assertion of the isolation strobe signal so the odd sense amplifiers can latch the values from the bit lines. The assertion of the sci odd signal 407 does not cause the values in the odd sense amplifiers to be affected by the voltage levels in the even sense amplifiers because of the relative beta values of the transistors. The sci odd signal at 407 could also be gated off to ensure that the odd sense amplifiers are isolated from the even sense amplifiers during the initial SC2 cycle as indicated by the dashed line 408.

Unlike the voltage values present on the true and complement bit lines provided to each sense amplifier, the voltage values present on the internal nodes of the sense amplifiers which are transferred via the transfer circuit are typically at a logic high and logic low voltage, e.g., approximately 3 V ($V_{DD}$) and approximately 0 V. Note that there is overlap between the odd and even sense amplifier strobes and the sci odd and even signals. That overlap may be, e.g., a 5 nanosecond overlap when the SC2 clocks are operating at 50 MHz, and could be shorter for higher speed operation. Such an overlap in the illustrated embodiment is sufficient to transfer a stored value from one sense amplifier to an adjacent sense amplifier.

Figure 5:
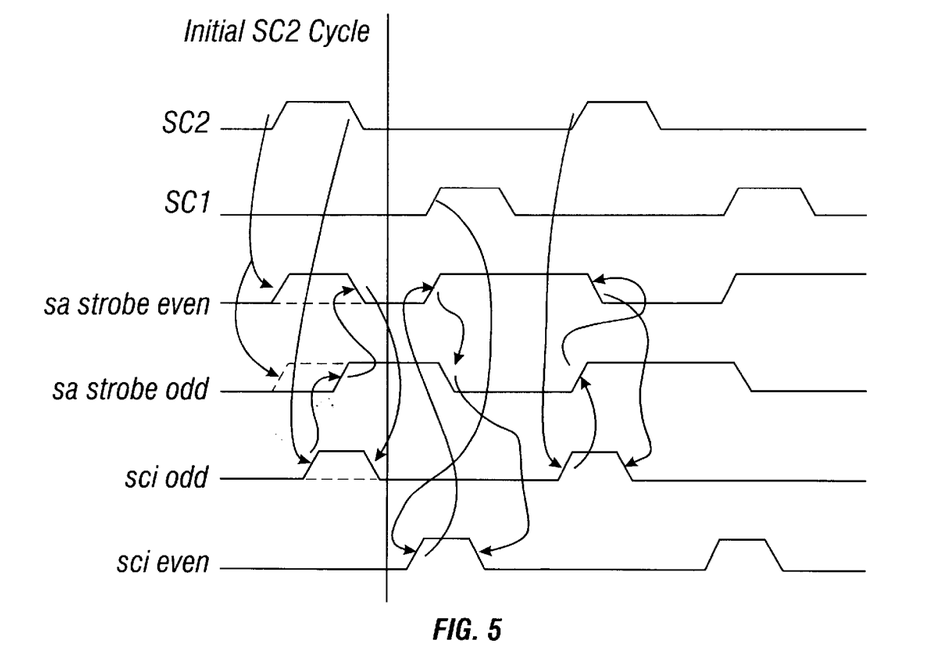
FIG. 5 shows the relationship between various edges of the clocks shown in FIG. 4.

FIG. 5 illustrates a clocking sequence for the relevant clocking signals. The sense amplifier strobe clocks and the sci odd and sci even signals, in the illustrated embodiment, are derived from the SC2 and SC1 scan clocks. The rising edge of the sense amplifier strobe even pulse (for addresses mapped to even sense amplifiers) follows the rising edge of the initial SC2 clock pulse. The rising edge of sci odd is gated by the falling edge of SC2 which causes sense amplifier strobe odd to rise which lets the even strobe fall. The rising edge of the SC1 clock causes the rising edge of the sci even pulse which allows sa strobe even to rise which, in turn, lets sense amp strobe odd to fall which lets sci even to fall. For the second SC2 cycle, the leading edge of SC2 is followed by the rising edge of sci odd which is followed by the rising edge of sense amplifier strobe odd. That rising edge allows the sa strobe even to fall which in turn allows the sci odd pulse to fall. The pulse width of the sci odd and sci even signals is not intended to be limited by the falling edge of the sa odd and even strobe pulses since the pulse width can of course be longer. The exact timing of the transfer clocks and sense amplifier latch strobes would be known to one of ordinary skill in the art based on the particular circuitry and clock speeds being utilized. FIG. 5 shows one timing approach that is appropriate for the illustrated embodiment at 50 MHz. The purpose for the interlocking signals shown in FIG. 5 is to give the design self tolerancing capability and margin to prevent negative overlap which could result in failure to transfer data.

The control logic, to supply the clocks in a test mode, can be readily derived from the timing diagrams shown. The control logic is located off-pitch, meaning that the control logic is not included in the columns of the array and therefore does not affect the density of the pitched cells of the array. The sci odd and sci even signals are turned off when the memory is being used during normal operations. The sense amp strobe signals are utilized during normal operations and will be activated according to the address that is being read.

Referring again to FIG. 3, the transfer circuits couple internal nodes of adjacent sense amplifiers in a symmetric manner. That means that the internal node coupled to the bit line true (btn), in one amplifier, e.g. node 327 is coupled to the bit line true (n+1) at internal node 337 in the adjacent amplifier via transistor 351 in transfer circuit 225. The internal node coupled to the bit line n complement (bcn), in one amplifier, e.g. node 329 is coupled to the bit line (n+1) complement internal node 339 in the adjacent amplifier via transistor 352 in the transfer circuit. The circuit may also be constructed by coupling a true node to an adjacent complement node and vice versa, e.g., node 327 to node 339 and node 329 to 337.

By coupling to the internal nodes of the sense amplifiers in the manner shown and described, the direction of transfer through the scan chain of sense amplifiers can be changed by applying clocks in a different sequence. Thus, while the description of the clocking sequence has described a serial transfer from left to right as shown in FIGS. 2 and 3, it is also possible to serially shift data from right to left. That would be accomplished by switching the sci odd and the sci even signals such that one is asserted in place of the other is asserted in FIG. 4. If bidirectional scanning capability is provided in the control logic, it would be possible to determine more information about the scan chain in the event a defect causes a break in the scan chain. The additional information can be obtained about the scan chain by shifting the other direction, thereby providing visibility into that part of the scan chain previously hidden due to the break.

Figure 6:
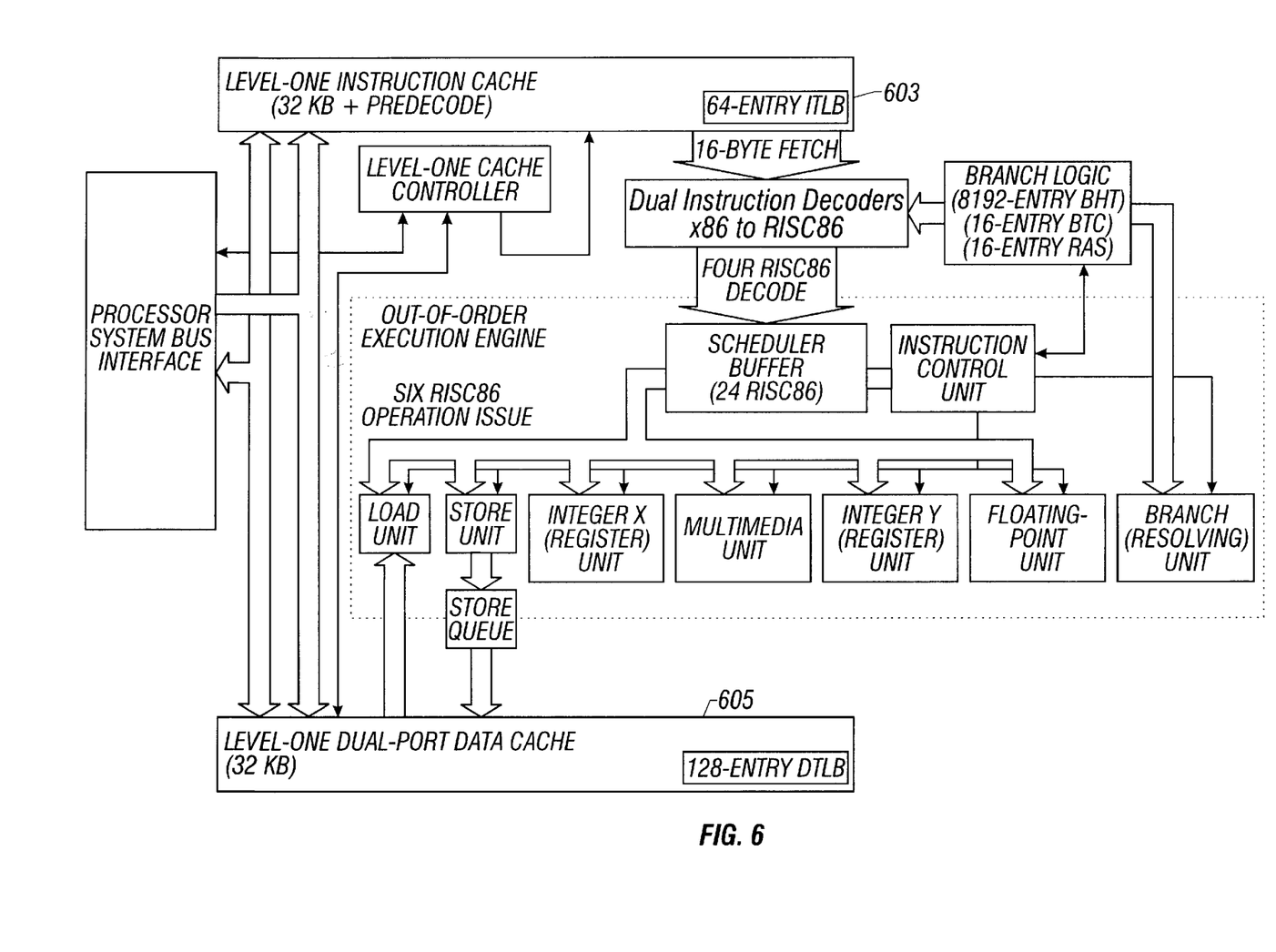
FIG. 6 shows an exemplary microprocessor integrated circuit in which the sense amplifiers and transfer circuits of the present invention may be advantageously employed.
Figure 7:
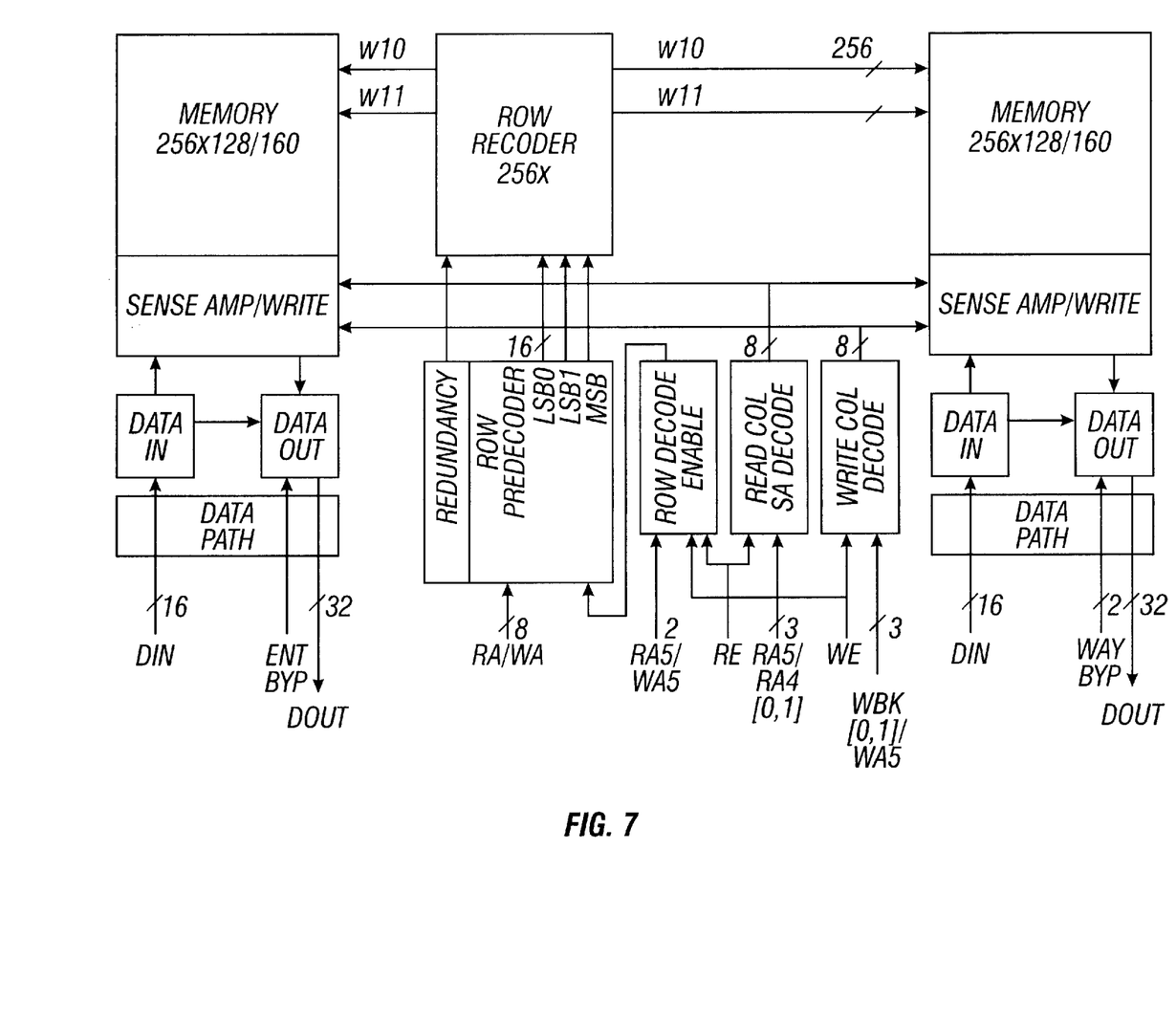
FIG. 7 shows a block diagram of one of the cache memories of the microprocessor of FIG. 6 utilizing the present invention.

In one embodiment of the invention, the memory array resides on an integrated circuit such as a microprocessor as data and/or instruction caches. That microprocessor may in turn be part of a computer system. Referring to FIG. 6, a microprocessor integrated circuit utilizing an embodiment of the sense amplifier scan circuits described herein is shown. The microprocessor integrated circuit includes instruction cache memory 603 and data cache memory 605. FIG. 7 shows a block diagram of one of the cache memories shown in FIG. 6. The scannable sense amplifiers described herein may be advantageously utilized in the cache memories shown in FIG. 6 to facilitate debug and testing of memory arrays. Scan of the sense amplifiers allows readout of the array data for debug and bitmap analysis. The invention described herein also allows for force out testability of the datapath logic.

A wide variety of computer systems may advantageously employ the scannable sense amplifiers disclosed herein. For example, one such computer system includes a microprocessor with at least one cache memory having the scannable sense amplifiers in accordance with the present invention, a bus coupling the microprocessor to other integrated circuits in the computer system, memory, and such input/output devices, disks, disk controllers, and other such devices and interfaces as may be found in conventional computer systems.

The scannable sense amplifiers disclosed herein may also be utilized effectively in SRAM and DRAM integrated circuit memory chips in addition to microprocessor integrated circuit chips.

Note that there may be extra transfer circuits, for example two transfer circuits and wire connections, where one group of sense amplifiers is physically separated from a next group of sense amplifiers such as between major sense amplifier groups. Where groups of sense amplifiers are widely separated, requiring particularly long wiring connections, additional circuitry may be required between such groups of sense amplifiers to achieve appropriate drive levels of the scan signals.

Figure 8A:
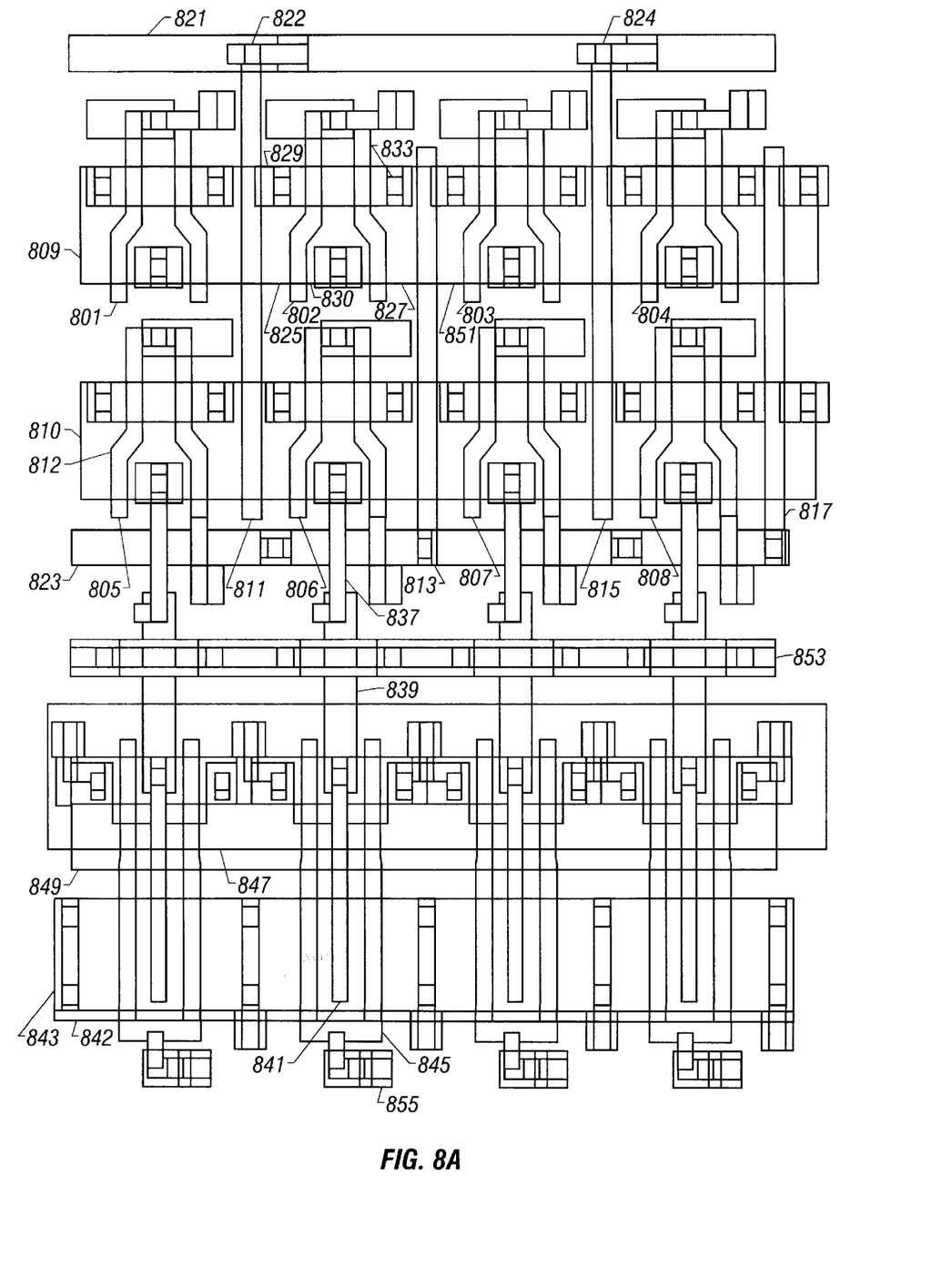
FIG. 8A shows a circuit layout of one portion of the sense amplifier and transfer circuits of the present invention and includes polysilicon, N-type and P-type active areas, local interconnects, first level metal and contacts, with the various features being identified with different fill patterns.
Figure 8B:
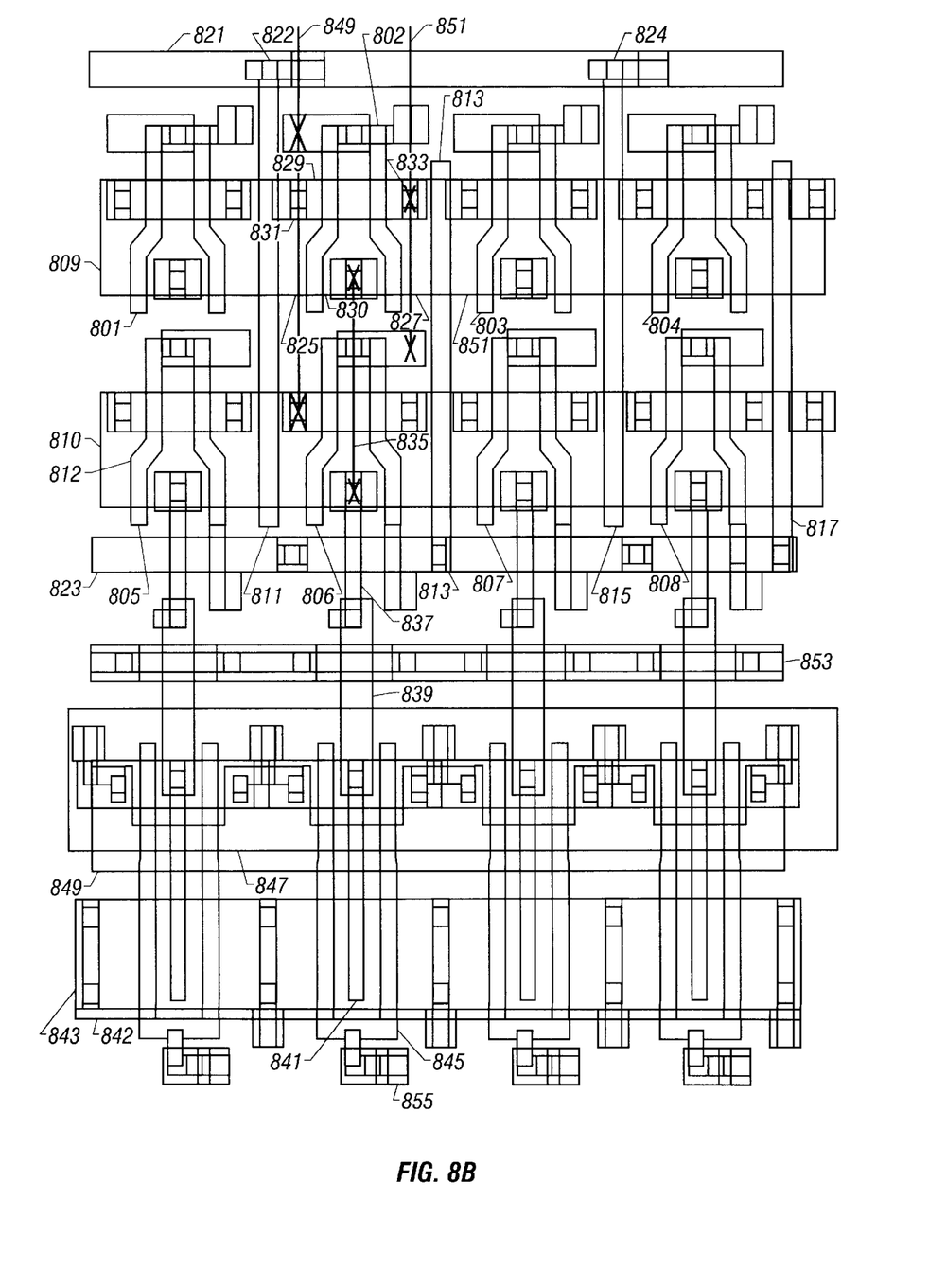
FIG. 8B shows the same features as FIG. 8A without any fill patterns to more easily identify features and to more easily show second level metal lines, where appropriate.

Referring to FIGS. 8A and 8B, one advantageous layout of one portion of the scannable sense amplifier of the present invention is shown. Generally U-shaped polysilicon regions 801 through 804 and 805 through 808 are arranged in two horizontal rows. Two regions of N-type active areas 809 and 810 extend horizontally and intersect the polysilicon structures 801–808 to form four pair of cross coupled transistors. A cross coupled pair corresponds to, e.g., transistors 303 and 305 shown in FIG. 3. Separating each pair of cross coupled transistors and intersecting both active areas 809 and 810 are polysilicon regions 811, 813, 815 and 817. The intersection of the two active areas 809 and 810 with each vertical stripe of polysilicon (811, 813, 815 and 817) forms the two NMOS transistors of the transfer circuit. Alternate ones of the polysilicon structures 811 and 815 are coupled to a metal line 821 at contacts 822 and 824 respectively. The metal line 821 corresponds to the sci odd signal 235. The even polysilicon structures 813 and 815 are connected to metal line 823 which corresponds to sci even signal 237. Note that while the legs of the U-shaped polysilicon regions forming the cross coupled NMOS transistors extend generally in a vertical direction, a forty five degree bend, e.g. at 812, is present in the legs of the structure of the illustrated embodiment.

An exemplary pair (of the four pair shown) of the NMOS cross coupled transistors formed with polysilicon regions 802 and 806 will be discussed in further detail. There are two drain regions of the transistor formed with polysilicon structure 802. The first drain region 825 is formed in the active area 809 bounded by the polysilicon vertical strip 811 and the adjacent leg of polysilicon structure 802. The second drain region 827 is formed in active area 809 and is bounded by the adjacent leg (i.e. the other leg) of polysilicon structure 802 and the vertical polysilicon strip 813. Note that the true and complement regions represented by the drains of the cross coupled transistors should be closely matched in terms of area. Thus, drain regions 825 and 827 should be closely matched to corresponding regions in the other transistor of the cross coupled pair. The two drain regions 825 and 827 are coupled together through small regions of local interconnect, contacts 831 and 833 and first level metal line 829.

The source region 830 of each cross coupled transistor is inside the U-shape and bounded by the legs of the U. The other transistor of the cross coupled transistor pair is displaced vertically below the first transistor of the pair and is formed using U-shaped polysilicon structure 806 and is similarly connected.

Note that the use of the terms drain and source are used in a conventional manner. The current handling terminal having a lower voltage is typically designated the source while the current handling terminal normally residing at the higher voltage is customarily called the drain. The terms are used herein for convenience in identifying particular areas of the structures being discussed and may also be referred as a source/drain region or drain/source region, especially where it is unclear which current handling terminal of the transistor has the higher voltage.

Referring to FIG. 8B, the source regions of both cross coupled transistors are coupled together by a second level metal line 835. The second level metal lines are shown as lines which are connected to underlying layers at X's. The local interconnect 837, which may be a tungsten silicide, first level metal layer 839 and local interconnect 841 couple the sources of the cross coupled transistors to the latch transistor which corresponds to latching transistor 308 in FIG. 3. The latch transistor is formed in N-type active area 843 with polysilicon structure 845. A first level metal layer 842 provides a connection to $V_{SS}$.

The cross coupling of the two NMOS transistors is accomplished by second level metal lines 849 and 851 (shown in FIG. 8B) which couple to the polysilicon structure 802 and the drain of the transistor formed with polysilicon structure 806. Metal line 851 couples the drain region 827 with the polysilicon structure 806 at the contacts indicated by X's, thus coupling the drain to the gate. The second level metal lines 849 and 851 extend to interconnect with isolation transistors 341 and 342 and the sense amplifier equilibrate transistors 343 and 344. Note that the second level metal lines shown are shown solely for purposes of illustrating electrical connections and the second level metal lines may extend further than shown to provide capacitive balancing. The pull-up transistor 311 is formed by the interconnection of polysilicon structure 845 and P-active area 849. A first level metal layer 847 provides $V_{DD}$.

The source/drain regions of the transistors forming the transfer circuits are common with the drain regions of the cross coupled NMOS transistors. Thus, the drain region 827 also provides a source/drain region for the transistor formed by vertical polysilicon structure 813 intersecting with active area 809. Similarly, the drain region 851 of the adjacent sense amplifier provides the source/drain region for that transistor.

The polysilicon strip 853 with associated contacts and local interconnects provide a guard ring for the cross coupled latches of the sense amplifier. Gate tie down diodes are utilized, such as gate tie down diode 855, to prevent breakdown of dielectric on floating polysilicon during plasma etching operations.

The vertical stripes of polysilicon forming the NMOS transistors of the transfer circuit replace what otherwise would have to be an isolation region formed as a shallow trench or field oxidation region. The isolation region would be needed to isolate adjacent sense amplifiers from each other. Since the two NMOS transistors are normally off, i.e., their gates are tied to ground, except during debugging or testing operation, the NMOS transistors of the transfer circuit function both to isolate the sense amplifiers as well as provide a way to implement master/slave flip-flops and thus provide a very low cost on-pitch scannable sense amplifier.

The channel length of the NMOS transistors, i.e., the width of the vertical polysilicon strips 811, 813, 815 and 817, may be longer than the channel length of the cross coupled NMOS transistors. A transistor with a longer channel length has a voltage threshold value greater than a shorter channel length transistor, thus more effectively isolating adjacent sense amplifiers.

Figure 9A:
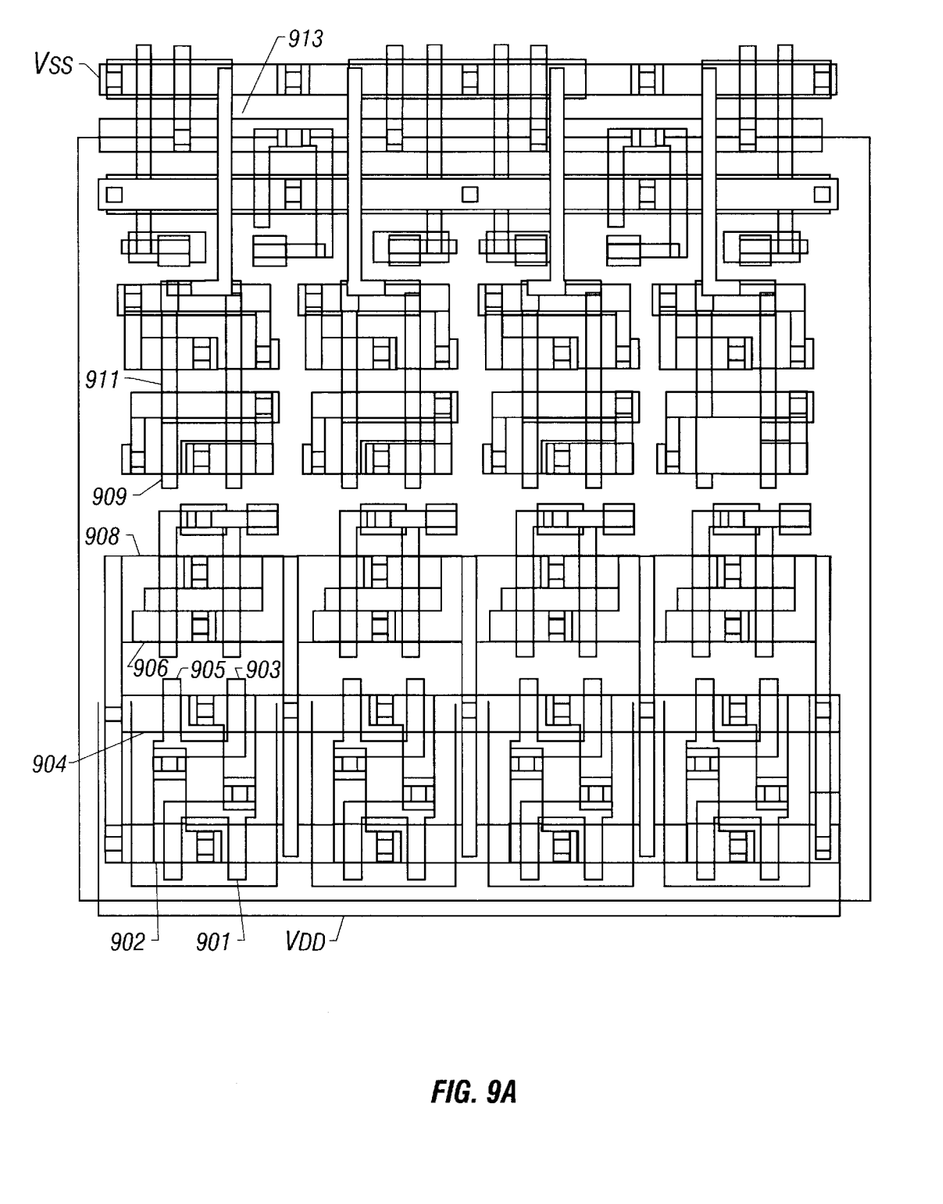
FIG. 9A shows additional portions of the layout of the sense amplifier and includes polysilicon, N-type and P-type active areas, local interconnects, first level metal and contacts, with the various features being identified with different fill patterns.
Figure 9B:
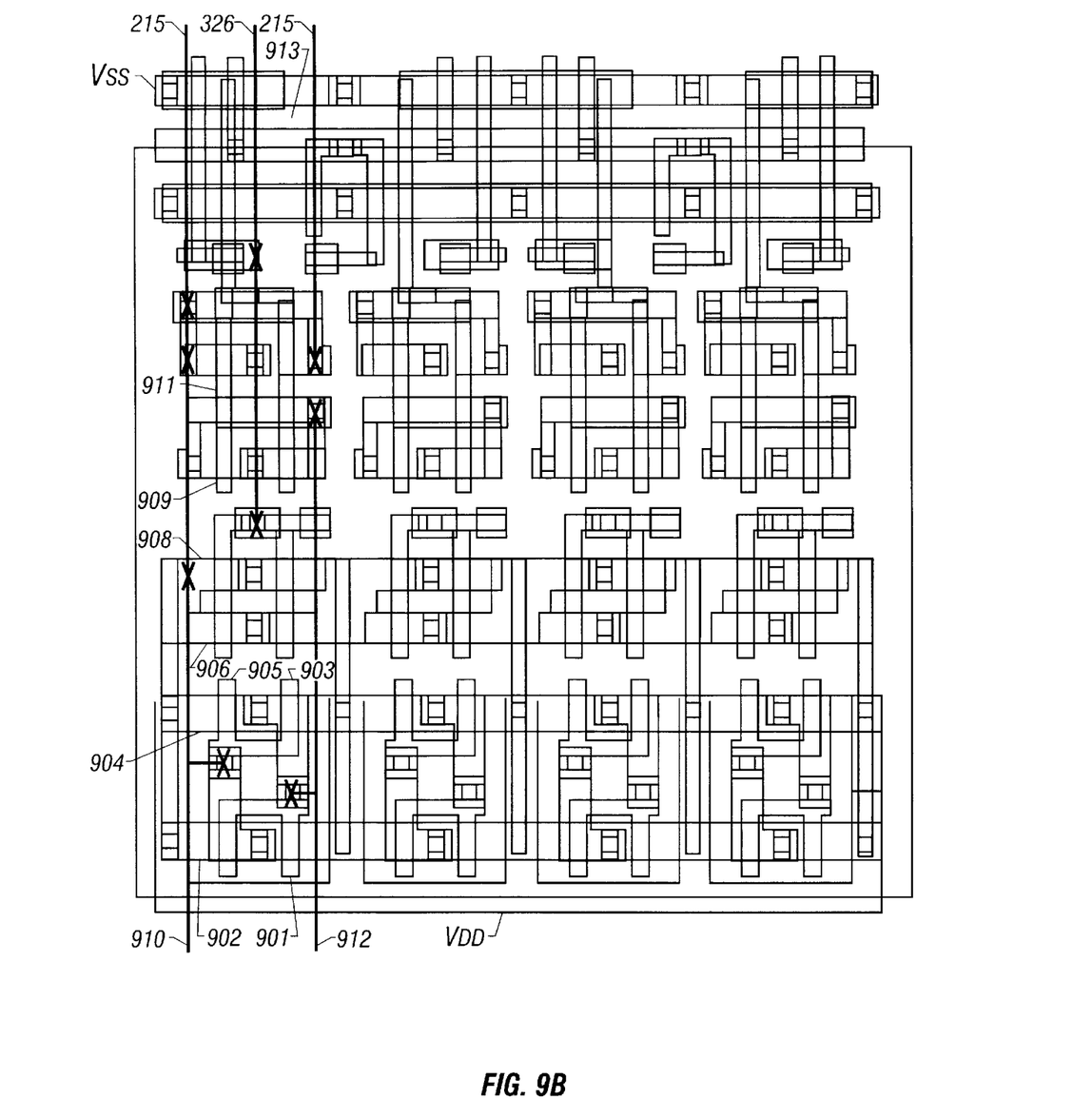
FIG. 9B shows the same features as FIG. 9A without any fill patterns to more easily identify features and to more easily show second level metal lines, where appropriate.

Referring to FIGS. 9A and 9B, the layout of an additional portion of the sense amplifier shown in FIG. 3, is illustrated. The cross coupled PMOS load transistors 307 and 309 are formed at polysilicon structures 901 and 903 intersecting with P-type active regions 902 and 904. The equilibrate transistors 343 and 344 are formed at the intersection of U-shaped polysilicon structure 905 and P-type active regions 906 and 907. The isolation transistors 341 and 342 correspond to the structures 909 and 911. NAND gate 340 is formed by the structures at 913. The second level metal lines are shown in FIG. 9B with connections indicated at X's. The second level metal lines 910 and 912 correspond to the second level metal lines 849 and 851, except they are shifted over by one transistor.

The description of the invention set forth herein is illustrative, and is not intended to limit the scope of the invention as set forth in the following claims. For instance while the transfer gates have been described as NMOS, in certain embodiments, they could also be PMOS. Variations and modifications of the embodiments disclosed herein, may be made based on the description set forth herein, without departing from the scope and spirit of the invention as set forth in the following claims.

What is claimed is:

1. A semiconductor memory device having a plurality of sense amplifiers, each of said sense amplifiers including a pair of cross coupled transistors, said device comprising:

a plurality of first polysilicon structures extending in a horizontal direction along first row in a reference plane generally parallel to a surface of a semiconductor substrate, each of said first polysilicon structures extending generally in a vertical direction parallel to said surface;

a first active region extending in a horizontal direction parallel to said surface and intersecting said first polysilicon structures, thereby forming first transistors having a channel of a first conductivity type, each of said first transistors being a first transistor of said pair of cross coupled transistors;

a plurality of second polysilicon structures extending in said horizontal direction along a second row parallel to said surface, each of said second polysilicon structures extending generally in said vertical direction and parallel to said surface, and wherein said second row is disposed vertically below said first row in said plane;

a second active region extending horizontally in a direction parallel to said surface and intersecting said second polysilicon structures, thereby forming second transistors having a channel of said first conductivity type, each of said second transistors being a second transistor of said pair of cross coupled transistors;

a plurality of third polysilicon structures extending in a horizontal direction parallel to said surface, each of said third polysilicon structures extending parallel to said surface in a vertical direction, each of said third polysilicon structures being disposed between two of said first polysilicon structures and two of said second polysilicon structures, said third polysilicon structures extending sufficiently in a vertical direction to intersect said first and second active regions, thereby forming respectively a third and fourth group of transistors having a channel region of said first conductivity type, said third and fourth group of transistors respectively coupling adjacent ones of said first and second groups of transistors.

2. The semiconductor memory device as recited in claim 1 wherein said third polysilicon structure includes alternating odd and even polysilicon structures, and wherein said device further comprises first and second conductors, said first conductor coupled to said odd polysilicon structures and said second conductor being coupled to said even polysilicon structures.

3. The semiconductor memory device as recited in claim 2 wherein said first and second conductors extend in a horizontal direction parallel to said first and second rows.

4. The semiconductor memory devices as recited in claim 2 wherein said wherein said third and fourth groups of transistors form as an isolation region between adjacent sense amplifiers when said first and second metal lines are at a first voltage level causing said third and fourth groups of transistors to be off.

5. The semiconductor memory device as recited in claim 1 wherein said first conductivity type is an n-type conductivity.

6. The semiconductor memory device as recited in claim 1 wherein a channel length of said third and fourth transistors is longer than a channel length of said first and second transistors.

7. The semiconductor memory device as recited in claim 1 wherein said first and second polysilicon structures are generally U-shaped having first and second legs generally vertically disposed, said first and second legs being coupled by a horizontal section of polysilicon at one end of said legs, each transistor of said first and second group of transistors having a first and second drain region being formed respectively outside said first and second legs and bounded by said first leg and one of said third polysilicon structures adjacent to said first leg and bounded by said second leg and another of said third polysilicon structures adjacent to said second leg and each transistor of said first and second group of transistors has a source region bounded by said first and second legs and said horizontal section.

8. The semiconductor memory device as recited in claim 7 wherein each of said first and second legs includes a bend, said bend being approximately at a forty-five degree angle.

9. The semiconductor device as recited in claim 7 wherein each of said third and fourth group of transistors has a first and second source/drain region, said first and second source/drain region of each of said third group of transistors being common with a first drain region of a first adjacent first transistor and a second drain region of a second adjacent first transistor, and said first and second source/drain region of each of said fourth group of transistors being common with a first drain region of a first adjacent second transistor and a second drain region of a second adjacent second transistor.

10. The semiconductor memory device as recited in claim 1 wherein said first and second polysilicon structures are generally U-shaped having first and second legs generally vertically disposed, said first and second legs being coupled by a horizontal section of polysilicon at one end of said legs, each transistor of said first and second group of transistors having a source region, formed respectively in said first and second active areas, bounded by said first and second legs and said horizontal section and wherein and said source region of said first transistor of each of said cross coupled pairs is coupled to said source region of said second transistor of each of said cross coupled pairs by a conductor, said source regions being further conductively coupled to respective latching transistors disposed vertically below, in said reference plane, each said cross coupled pair.

11. The semiconductor memory device as recited claim 1 wherein respective ones of said third polysilicon structures disposed between respective pairs of adjacent coupled transistors isolate said respective pairs when respective ones of said third polysilicon structures are coupled to a first reference voltage.

12. An apparatus comprising:

a microprocessor including a memory;

said memory including a plurality of sense amplifiers, each of said sense amplifiers including a pair of cross coupled transistors, said memory including, a plurality of first polysilicon structures extending in a horizontal direction along first row in a reference plane generally parallel to a surface of a semiconductor substrate, each of said first polysilicon structures extending generally in a vertical direction parallel to said surface;

a first active region extending in a horizontal direction parallel to said surface and intersecting said first polysilicon structures, thereby forming first transistors having a channel of a first conductivity type, each of said first transistors being a first transistor of said pair of cross coupled transistors;

a plurality of second polysilicon structures extending in said horizontal direction along a second row parallel to said surface, each of said second polysilicon structures extending generally in said vertical direction and parallel to said surface, and wherein said second row is disposed vertically below said first row in said plane;

a second active region extending horizontally in a direction parallel to said surface and intersecting said second polysilicon structures, thereby forming second transistors having a channel of said first conductivity type, each of said second transistors being a second transistor of said pair of cross coupled transistors; and a plurality of third polysilicon structures extending in a horizontal direction parallel to said surface, each of said third polysilicon structures extending parallel to said surface in a vertical direction, each of said third polysilicon structures being disposed between two of said first polysilicon structures and two of said second polysilicon structures, said third polysilicon structures extending sufficiently in a vertical direction to intersect said first and second active regions, thereby forming respectively a third and fourth group of transistors having a channel region of said first conductivity type, said third and fourth group of transistors respectively coupling adjacent ones of said first and second groups of transistors.

13. The apparatus of claim 12 wherein said memory is at least one of a data cache and an instruction cache memory.

14. The apparatus of claim 12 further comprising:

a bus coupled to said microprocessor; and another integrated circuit coupled to said bus.

15. A method in a semiconductor memory device having a plurality of sense amplifiers, wherein each of said sense amplifiers includes a pair of cross coupled transistors, said method comprising:

providing a plurality of first polysilicon structures extending in a horizontal direction along first row in a reference plane generally parallel to a surface of a semiconductor substrate, each of said first polysilicon structures extending generally in a vertical direction parallel to said surface;

providing a first active region extending in a horizontal direction parallel to said surface and intersecting said first polysilicon structures, thereby forming first transistors having a channel of a first conductivity type, each of said first transistors being a first transistor of said pair of cross coupled transistors;

providing a plurality of second polysilicon structures extending in said horizontal direction along a second row parallel to said surface, each of said second polysilicon structures extending generally in said vertical direction and parallel to said surface, and wherein said second row is disposed vertically below said first row in said plane;

providing a second active region extending horizontally in a direction parallel to said surface and intersecting said second polysilicon structures, thereby forming second transistors having a channel of said first conductivity type, each of said second transistors being a second transistor of said pair of cross coupled transistors;

providing a plurality of third polysilicon structures extending in a horizontal direction parallel to said surface, each of said third polysilicon structures extending parallel to said surface in a vertical direction, each of said third polysilicon structures being disposed between two of said first polysilicon structures and two of said second polysilicon structures, said third polysilicon structures extending sufficiently in a vertical direction to intersect said first and second active regions, thereby forming respectively a third and fourth group of transistors having a channel region of said first conductivity type, said third and fourth group of transistors respectively coupling adjacent ones of said first and second groups of transistors.

* * * * *